(12) United States Patent
Liu

(10) Patent No.: US 11,374,079 B2
(45) Date of Patent: Jun. 28, 2022

(54) DISPLAY SUBSTRATE HAVING LIGHT SHIELDING LAYER IN INTER-SUBPIXEL REGION

(71) Applicant: BOE Technology Group Co., Ltd., Beijing (CN)

(72) Inventor: Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 877 days.

(21) Appl. No.: 16/080,952

(22) PCT Filed: Sep. 4, 2017

(86) PCT No.: PCT/CN2017/100337
§ 371 (c)(1),
(2) Date: Aug. 29, 2018

(87) PCT Pub. No.: WO2019/041337
PCT Pub. Date: Mar. 7, 2019

(65) Prior Publication Data
US 2021/0183978 A1 Jun. 17, 2021

(51) Int. Cl.
*H01L 27/32* (2006.01)
*H01L 27/12* (2006.01)
*H01L 51/52* (2006.01)

(52) U.S. Cl.
CPC ........ *H01L 27/3272* (2013.01); *H01L 27/124* (2013.01); *H01L 27/322* (2013.01);
(Continued)

(58) Field of Classification Search
CPC ............... H01L 27/3272; H01L 27/124; H01L 27/3258; H01L 27/3262; H01L 27/3276; H01L 51/5237; H01L 27/322
(Continued)

(56) References Cited

U.S. PATENT DOCUMENTS

2006/0103786 A1    5/2006   Koma et al.
2010/0156860 A1*   6/2010   Yamamoto ........... G09G 3/3275
                                                          345/205
(Continued)

FOREIGN PATENT DOCUMENTS

CN          1755462 A        4/2006
CN        101819362 A        9/2010
(Continued)

OTHER PUBLICATIONS

Extended European Search Report in the European Patent Application No. 17905012.5, dated Mar. 19, 2021.
(Continued)

*Primary Examiner* — Xia L Cross
(74) *Attorney, Agent, or Firm* — Intellectual Valley Law, P.C.

(57) ABSTRACT

The present application discloses a display substrate. The display substrate includes a base substrate; a thin film transistor for driving image display including an active layer; and a first light shielding layer on the base substrate and in an inter-subpixel region between two adjacent sub-pixel regions. A projection of the first light shielding layer on the base substrate at least partially covers a projection of the inter-subpixel region between two adjacent subpixel regions on the base substrate. The projection of the first light shielding layer on the base substrate is outside a projection of the active layer on the base substrate.

18 Claims, 14 Drawing Sheets

(52) U.S. Cl.
CPC ...... *H01L 27/3258* (2013.01); *H01L 27/3262* (2013.01); *H01L 27/3276* (2013.01); *H01L 51/5237* (2013.01)

(58) Field of Classification Search
USPC .......................................................... 257/72
See application file for complete search history.

(56) References Cited

U.S. PATENT DOCUMENTS

| | | | |
|---|---|---|---|
| 2012/0176045 A1* | 7/2012 | Omoto | ................ H01L 27/3276 315/161 |
| 2014/0264491 A1 | 9/2014 | Huang et al. | |
| 2015/0378182 A1 | 12/2015 | Shin et al. | |
| 2016/0202582 A1 | 7/2016 | Paek et al. | |
| 2017/0084676 A1* | 3/2017 | Jang | .................... H01L 51/5225 |
| 2017/0176828 A1 | 6/2017 | Tseng et al. | |
| 2017/0186831 A1* | 6/2017 | Nam | ........................ H01L 51/52 |
| 2017/0219892 A1 | 8/2017 | Chen | |
| 2017/0338252 A1* | 11/2017 | Lee | .................. H01L 29/78633 |
| 2018/0046040 A1 | 2/2018 | Shao et al. | |
| 2018/0113357 A1 | 4/2018 | Han et al. | |
| 2018/0224704 A1 | 8/2018 | Shao et al. | |
| 2019/0288056 A1 | 9/2019 | Xiao et al. | |

FOREIGN PATENT DOCUMENTS

| | | |
|---|---|---|
| CN | 104934449 A | 9/2015 |
| CN | 105219149 A | 1/2016 |
| CN | 105824161 A | 8/2016 |
| CN | 106200151 A | 12/2016 |
| CN | 106569361 A | 4/2017 |
| CN | 106896961 A | 6/2017 |
| CN | 107093618 A | 8/2017 |
| CN | 107121861 A | 9/2017 |
| JP | 2002015861 A | 1/2002 |
| JP | 2002352955 A | 12/2002 |
| JP | 2005159115 A | 6/2005 |
| JP | 2016080956 A | 5/2016 |
| KR | 20160019076 A | 2/2016 |

OTHER PUBLICATIONS

First Office Action in the Japanese Patent Application No. 2019503543, dated Apr. 6, 2021; English translation attached.
First Office Action in the Chinese Patent Application No. 201780000958.2 dated Aug. 13, 2020; English translation attached.
First Office Action in the Indian Patent Application No. 201847041168 dated May 10, 2021.

* cited by examiner

DISPLAY SUBSTRATE HAVING LIGHT SHIELDING LAYER IN INTER-SUBPIXEL REGION

CROSS-REFERENCE TO RELATED APPLICATION

This application is a national stage application under 35 U.S.C. § 371 of International Application No. PCT/CN2017/100337, filed Sep. 4, 2017, the contents of which are incorporated by reference in the entirety.

TECHNICAL FIELD

The present invention relates to display technology, more particularly, to a display substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including a light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides a display substrate, comprising a base substrate; a thin film transistor for driving image display comprising an active layer; and a first light shielding layer on the base substrate and in an inter-subpixel region between two adjacent subpixel regions; wherein a projection of the first light shielding layer on the base substrate at least partially covers a projection of the inter-subpixel region between two adjacent subpixel regions on the base substrate; and the projection of the first light shielding layer on the base substrate is outside a projection of the active layer on the base substrate.

Optionally, the display substrate further comprises a first insulating layer on a side of the first light shielding layer distal to the base substrate; a first data line in the inter-subpixel region between two adjacent subpixel regions on a side of the first insulating layer distal to the first light shielding layer; and a first via extending through the first insulating layer; wherein the first light shielding layer is electrically connected to the first data line through the first via.

Optionally, the thin film transistor comprises a gate electrode in a same layer as the first light shielding layer.

Optionally, the display substrate further comprises a second light shielding layer; wherein a projection of the second light shielding layer on the base substrate substantially covers a projection of the active layer on the base substrate.

Optionally, the first light shielding layer and the second light shielding layer are in a same layer.

Optionally, the display substrate further comprises a second insulating layer between the first insulating layer and the base substrate; wherein the first via extends through the first insulating layer and the second insulating layer.

Optionally, the display substrate further comprises a third light shielding layer in the inter-subpixel region between two adjacent subpixel regions, the third light shielding layer and the first light shielding layer in different layers; wherein a projection of the third light shielding layer on the base substrate at least partially covers the projection of the inter-subpixel region between two adjacent subpixel regions on the base substrate; and the projection of the third light shielding layer on the base substrate is outside the projection of the active layer on the base substrate.

Optionally, the display substrate further comprises a first data line and a second data line in the inter-subpixel region between two adjacent subpixel regions, the second data line and the first data line in a same layer; wherein the first light shielding layer is electrically connected to the first data line; and the third light shielding layer is electrically connected to the second data line.

Optionally, the display substrate further comprises a first insulating layer between the first data line and the first light shielding layer; a first via extending through the first insulating layer; a second insulating layer between the first insulating layer and the third light shielding layer; and a second via extending through the first insulating layer and the second insulating layer; wherein the first light shielding layer is electrically connected to the first data line through the first via; and the third light shielding layer is electrically connected to the second data line through the second via.

Optionally, projections of the first light shielding layer and the third light shielding layer on the base substrate partially overlap with each other.

Optionally, combined projections of the first light shielding layer and the third light shielding layer on the base substrate substantially cover the projection of the inter-subpixel region between two adjacent subpixel regions on the base substrate.

Optionally, the display substrate further comprises a passivation layer on a side of the first light shielding layer distal to the base substrate; and a color filter layer on a side of the passivation layer distal to the first light shielding layer, wherein the color filter layer comprises a plurality of color filter blocks; a region between adjacent color filter blocks of the plurality of color filter blocks is in the inter-subpixel region between two adjacent subpixel regions; and the projection of the first light shielding layer on the base substrate at least partially covers a projection of the region between adjacent color filter blocks of the plurality of color filter blocks on the base substrate.

Optionally, the display substrate further comprises a third light shielding layer in the inter-subpixel region between two adjacent subpixel regions, the third light shielding layer and the first light shielding layer in different layers; wherein a projection of the third light shielding layer on the base substrate at least partially covers the projection of the region between adjacent color filter blocks of the plurality of color filter blocks on the base substrate; and the projection of the third light shielding layer on the base substrate is outside the projection of the active layer on the base substrate.

Optionally, the display substrate further comprises a first data line and a second data line in the inter-subpixel region between two adjacent subpixel regions, the second data line and the first data line in a same layer; wherein the first light shielding layer is electrically connected to the first data line; and the third light shielding layer is electrically connected to the second data line.

Optionally, the display substrate further comprises a second insulating layer on a side of the third light shielding layer distal to the base substrate, the second insulating layer between the first light shielding layer and the third light shielding layer; a first insulating layer on a side of the first light shielding layer distal to the second insulating layer, the first insulating layer between the first light shielding layer and the first data line; a first via extending through the first insulating layer; and a second via extending through the first insulating layer and the second insulating layer, wherein the first light shielding layer is electrically connected to the first data line through the first via; and the third light shielding layer is electrically connected to the second data line through the second via.

Optionally, combined projections of the first light shielding layer and the third light shielding layer on the base substrate substantially cover the projection of the region between adjacent color filter blocks of the plurality of color filter blocks on the base substrate.

Optionally, the thin film transistor comprises a gate electrode in a same layer as the first light shielding layer; the display substrate further comprises a second light shielding layer, a projection of the second light shielding layer on the base substrate substantially covers a projection of the active layer on the base substrate; and the third light shielding layer and the second light shielding layer are in a same layer.

Optionally, the thin film transistor is a top-gate type thin film transistor; and the gate electrode is on a side of the active layer distal to the base substrate.

Optionally, the display substrate is an organic light emitting diode display substrate; and the display substrate further comprises a plurality of organic light emitting diodes, each of which on a side of a color filter block of the plurality of color filter blocks distal to the base substrate.

Optionally, the display substrate is a bottom-emission type display substrate.

In another aspect, the present invention provides a display apparatus comprising the display substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
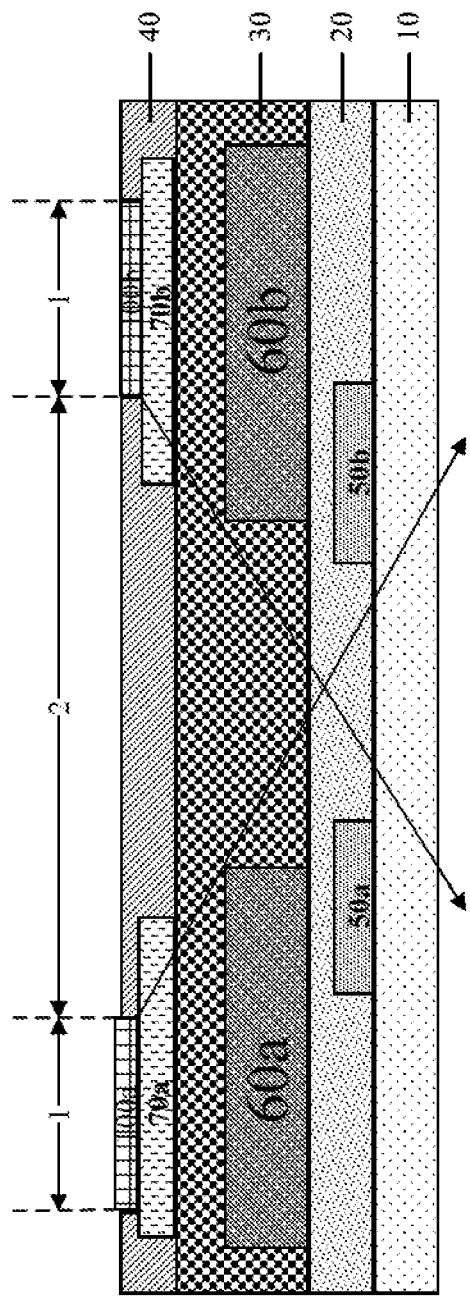
FIG. 1 is a schematic diagram illustrating the structure of a conventional display substrate.

FIG. 1 is a schematic diagram illustrating the structure of a conventional display substrate. Referring to FIG. 1, the conventional display substrate has a subpixel region 1 and an inter-subpixel region 2. As shown in FIG. 1, in the conventional display substrate, light emitted from the subpixel region 1 (e.g., from an organic light emitting diode 100a or 100b) can transmit through the inter-subpixel region 2. The light leakage is particularly problematic when the display substrate is a bottom light emitting display substrate. Even though the dimensions of the inter-subpixel region 2 and the subpixel region 1, and position and dimension of the color filter blocks 60a and 60b may be designed to reduce light leakage in the inter-subpixel region 2 as little as possible. However, the light leakage issue cannot be avoided in the conventional display substrate when there is even a slight misalignment between various relevant layers of the display substrate. Because the light transmitted through the inter-subpixel region 2 are white light, it also affects color display of a display panel having the conventional display substrate.

Accordingly, the present disclosure provides, inter alia, a display substrate and a display apparatus that substantially obviate one or more of the problems due to limitations and disadvantages of the related art. In one aspect, the present disclosure provides a display substrate. In some embodiments, the display substrate includes a base substrate; a thin film transistor for driving image display comprising an active layer; and a first light shielding layer on the base substrate and in an inter-subpixel region between two adjacent subpixel regions. A projection of the first light shielding layer on the base substrate at least partially covers a projection of the inter-subpixel region between two adjacent subpixel regions on the base substrate. The projection of the first light shielding layer on the base substrate is outside a projection of the active layer on the base substrate. As used herein, a subpixel region refers to a light emission region of a subpixel, such as a region corresponding to a pixel electrode in a liquid crystal display or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 2:
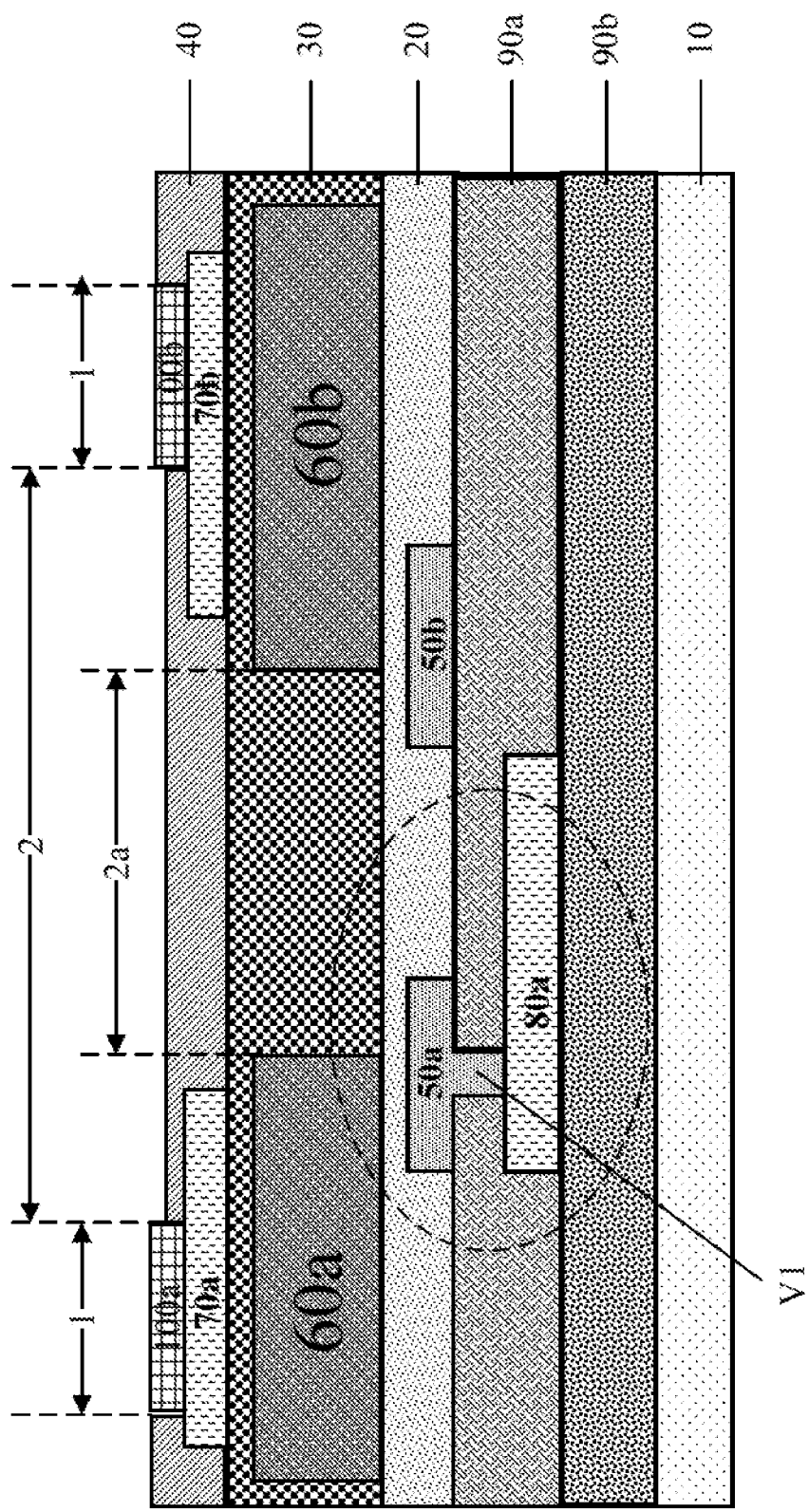
FIG. 2 is a schematic diagram illustrating the structure of a display substrate in some embodiments according to the present disclosure.
Figure 3:
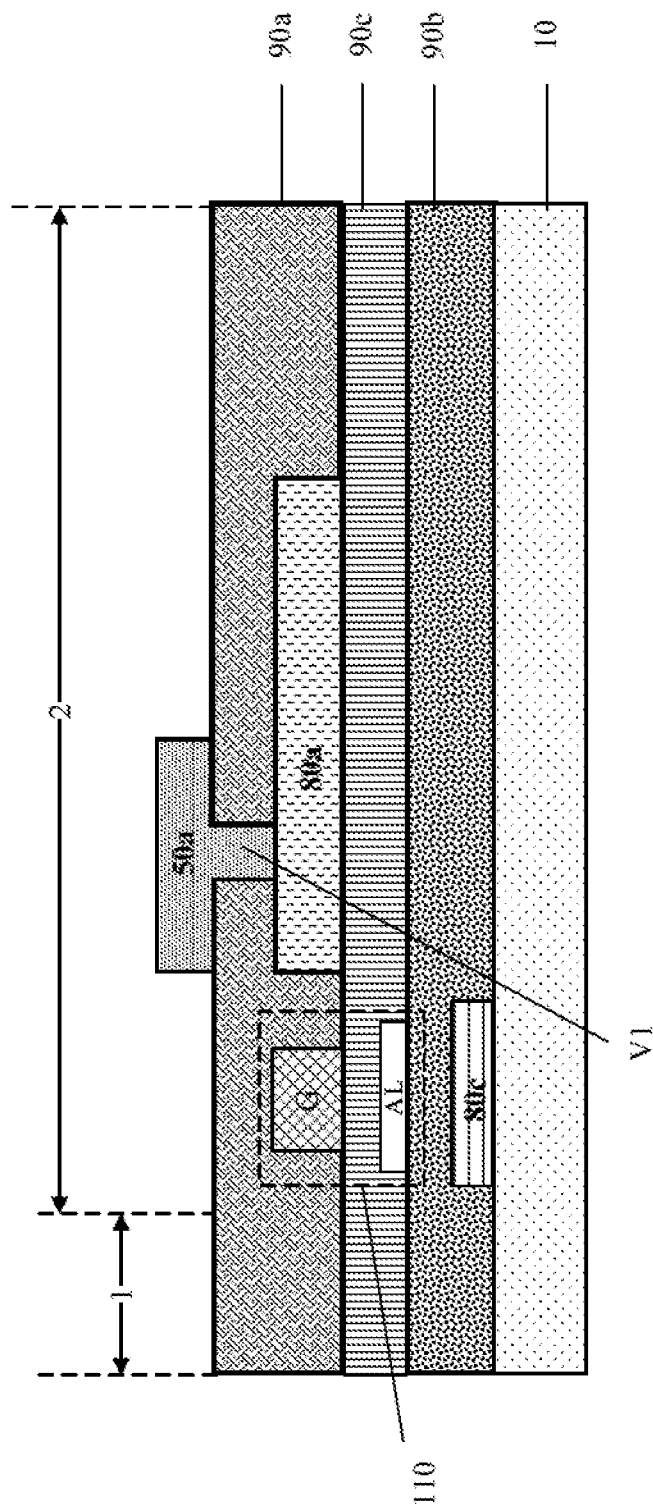
FIG. 3 is a zoom-in view of an area encircled by dotted lines in FIG. 2.

FIG. 2 is a schematic diagram illustrating the structure of a display substrate in some embodiments according to the present disclosure. FIG. 3 is a zoom-in view of an area encircled by dotted lines in FIG. 2. Referring to FIG. 2 and FIG. 3, the display substrate in some embodiments includes a base substrate 10, and a thin film transistor 110 for driving image display of the display substrate. As shown in FIG. 3, the thin film transistor 110 in some embodiments includes a gate electrode G and an active layer AL. Optionally, the thin film transistor further includes other components such as a source electrode and a drain electrode, and so on. The display substrate has a subpixel region 1 and an inter-subpixel region 2. Optionally, the thin film transistor 110 is in the inter-subpixel region 2. The display substrate further includes a first light shielding layer 80a in an inter-subpixel region 2 between two adjacent subpixel regions 1. A projection of the first light shielding layer 80a on the base substrate 10 at least partially covers a projection of the inter-subpixel region 2 between two adjacent subpixel regions 1 on the base substrate 10. Optionally, the projection of the first light shielding layer 80a on the base substrate 10 completely covers a projection of the inter-subpixel region 2 between two adjacent subpixel regions 1 on the base substrate 10. Optionally, the first light shielding layer 80a is configured to, alone or in combination with another light shielding layer, block light leakage in the inter-subpixel region 2 between two adjacent subpixel regions 1. As shown in FIG. 3, the projection of the first light shielding layer 80a on the base substrate 10 is outside a projection of the active layer AL on the base substrate 10, e.g., projections of the first light shielding layer 80a and the active layer AL on the base substrate 10 are substantially non-overlapping.

Figure 4:
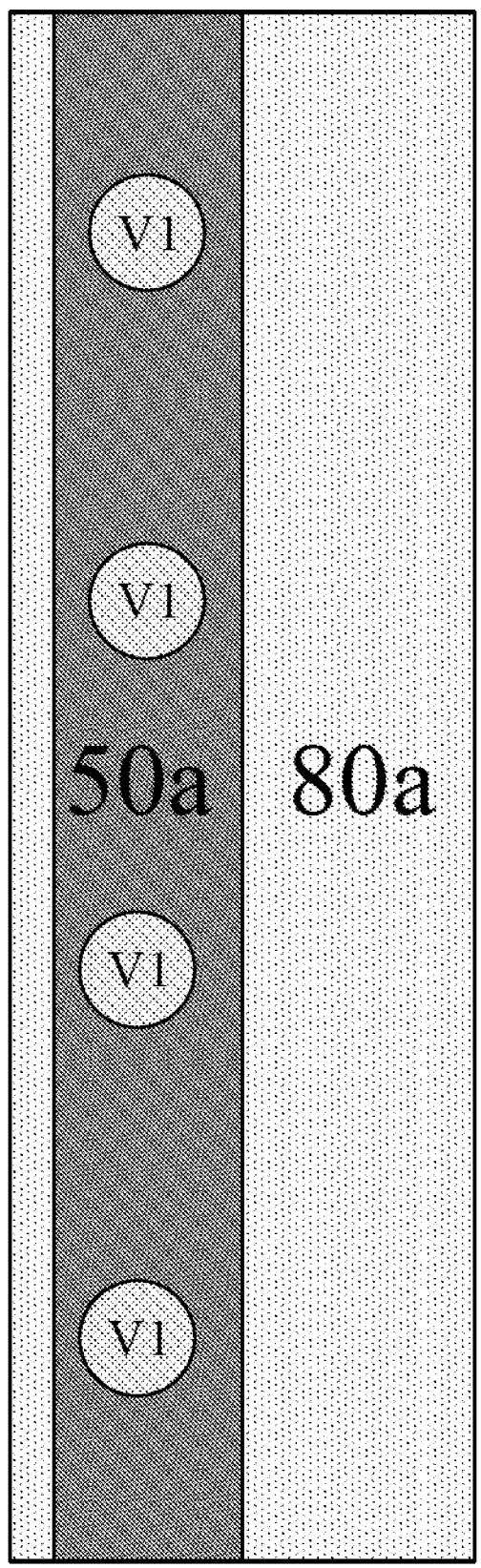
FIG. 4 is a schematic diagram illustrating the structure of the first data line 50a and the first light shielding layer 80a in plan view of the display substrate.

In some embodiments, the display substrate further includes a first insulating layer 90a on a side of the first light shielding layer 80a distal to the base substrate 10; a first data line 50a in the inter-subpixel region 2 between two adjacent subpixel regions 1 on a side of the first insulating layer 90a distal to the first light shielding layer 80a; and a first via V1 extending through the first insulating layer 90a. The first light shielding layer 80a is electrically connected to the first data line 50a through the first via V1. By having this design, the first data line 50a and the first light shielding layer 80a constitute a data line having a double-sublayer structure, the first sublayer being the first data line 50a, the second sublayer being the first light shielding layer 80a. The first sublayer and the second sublayer are electrically connected in parallel for transmitting data signals, effectively lowering the resistance of the data line. FIG. 4 is a schematic diagram illustrating the structure of the first data line 50a and the first light shielding layer 80a in plan view of the display substrate.

Figure 5:
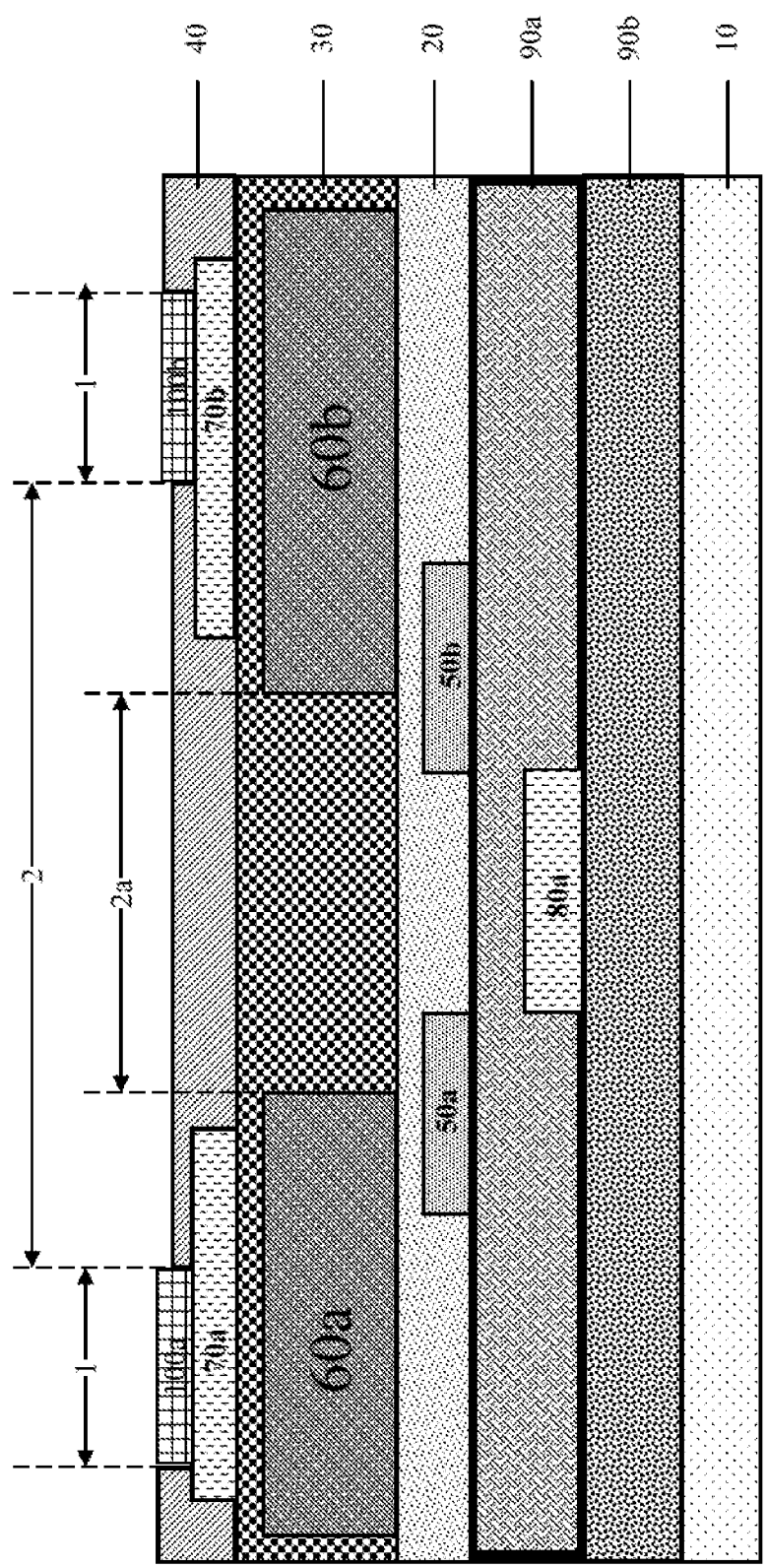
FIG. 5 is a schematic diagram illustrating the structure of a display substrate in some embodiments according to the present disclosure.

FIG. 5 is a schematic diagram illustrating the structure of a display substrate in some embodiments according to the present disclosure. Referring to FIG. 5, in some embodiments, the first light shielding layer 80a is not electrically connected to the first data line 50a. To reduce parasitic capacitance between the first light shielding layer 80a and the data line (e.g., the first data line 50a), a projection of the first light shielding layer 80a on the base substrate 10 in some embodiments is substantially non-overlapping with a projection of any data line (e.g., the first data line 50a) in the display substrate on the base substrate 10. Optionally, the projection of the first light shielding layer 80a on the base substrate 10 partially overlaps with the projection of any data line (e.g., the first data line 50a) in the display substrate on the base substrate 10. Optionally, the projection of the first light shielding layer 80a on the base substrate 10 completely covers a projection of the inter-subpixel region 2 between two adjacent subpixel regions 1 on the base substrate 10.

The first light shielding layer 80a may be formed in any appropriate position or layer of the display substrate as long as it at least partially covers a projection of the inter-subpixel region 2 between two adjacent subpixel regions 1 on the base substrate 10, e.g., is configured to, alone or in combination with another light shielding layer, block light leakage in the inter-subpixel region 2 between two adjacent subpixel regions 1.

Referring to FIG. 3, the first light shielding layer 80a in some embodiments is in a same layer as the gate electrode G of the thin film transistor 110. As used herein, the term "same layer" refers to the relationship between the layers simultaneously formed in the same step. In one example, the gate electrode G and the first light shielding layer 80a are in a same layer when they are formed as a result of one or more steps of a same patterning process performed in a same layer of material. In another example, the gate electrode G and the first light shielding layer 80a can be formed in a same layer by simultaneously performing the step of forming the gate electrode G and the step of forming the first light shielding layer 80a. The term "same layer" does not always mean that the thickness of the layer or the height of the layer in a cross-sectional view is the same.

Referring to FIG. 3, the display substrate in some embodiments further includes a second light shielding layer 80c. The second light shielding layer 80c is configured to shield the active layer AL (and particularly the channel region of the active layer AL) from light. Optionally, a projection of the second light shielding layer 80e on the base substrate 10 substantially covers a projection of the active layer AL on the base substrate 10. The projection of the first light shielding layer 80a on the base substrate 10 is, however, outside a projection of the active layer AL on the base substrate 10. As shown in FIG. 3, the first light shielding layer 80a and the second light shielding layer 80c are in different layers.

Figure 6:
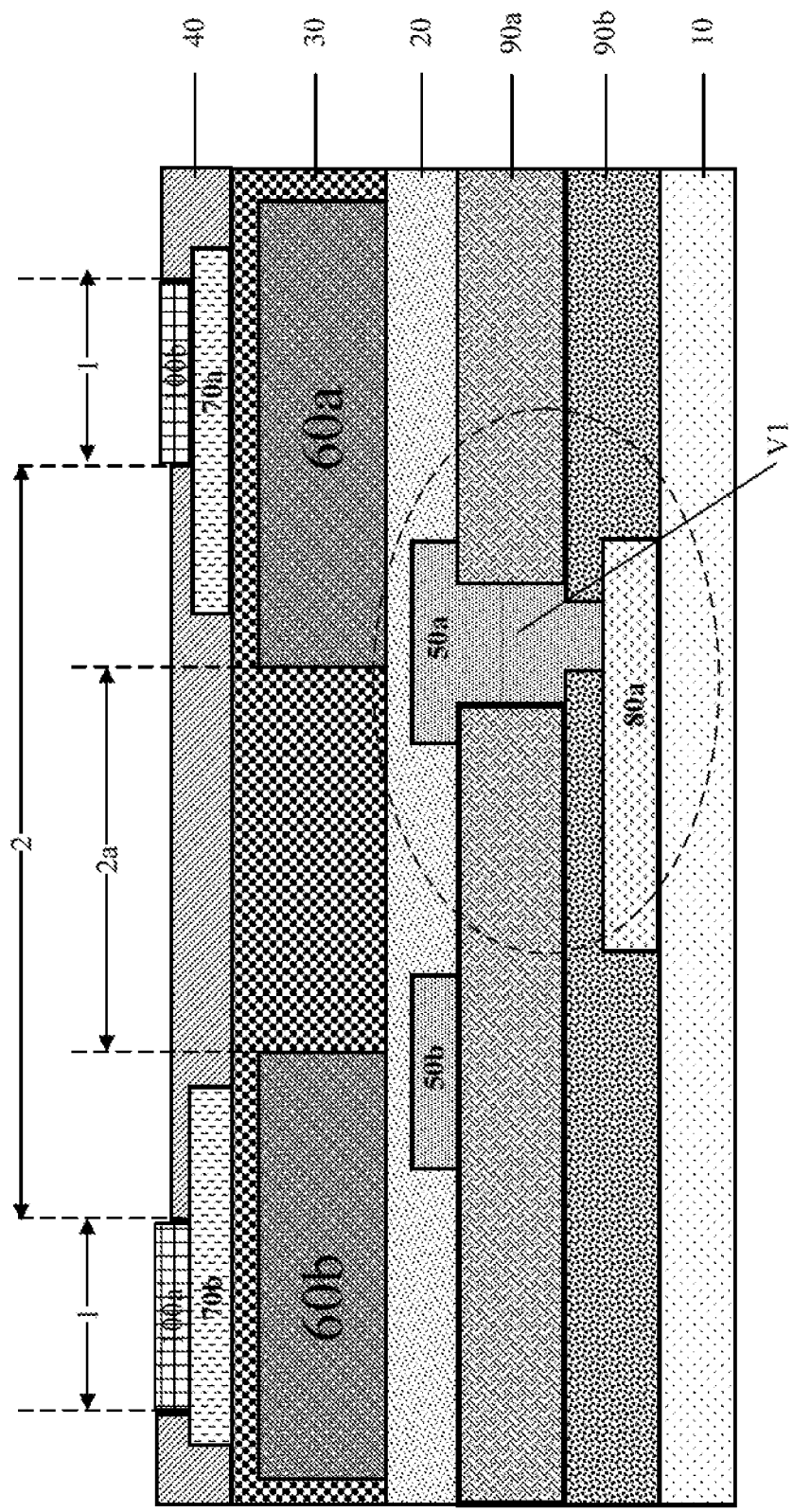
FIG. 6 is a schematic diagram illustrating the structure of a display substrate in some embodiments according to the present disclosure.
Figure 7:
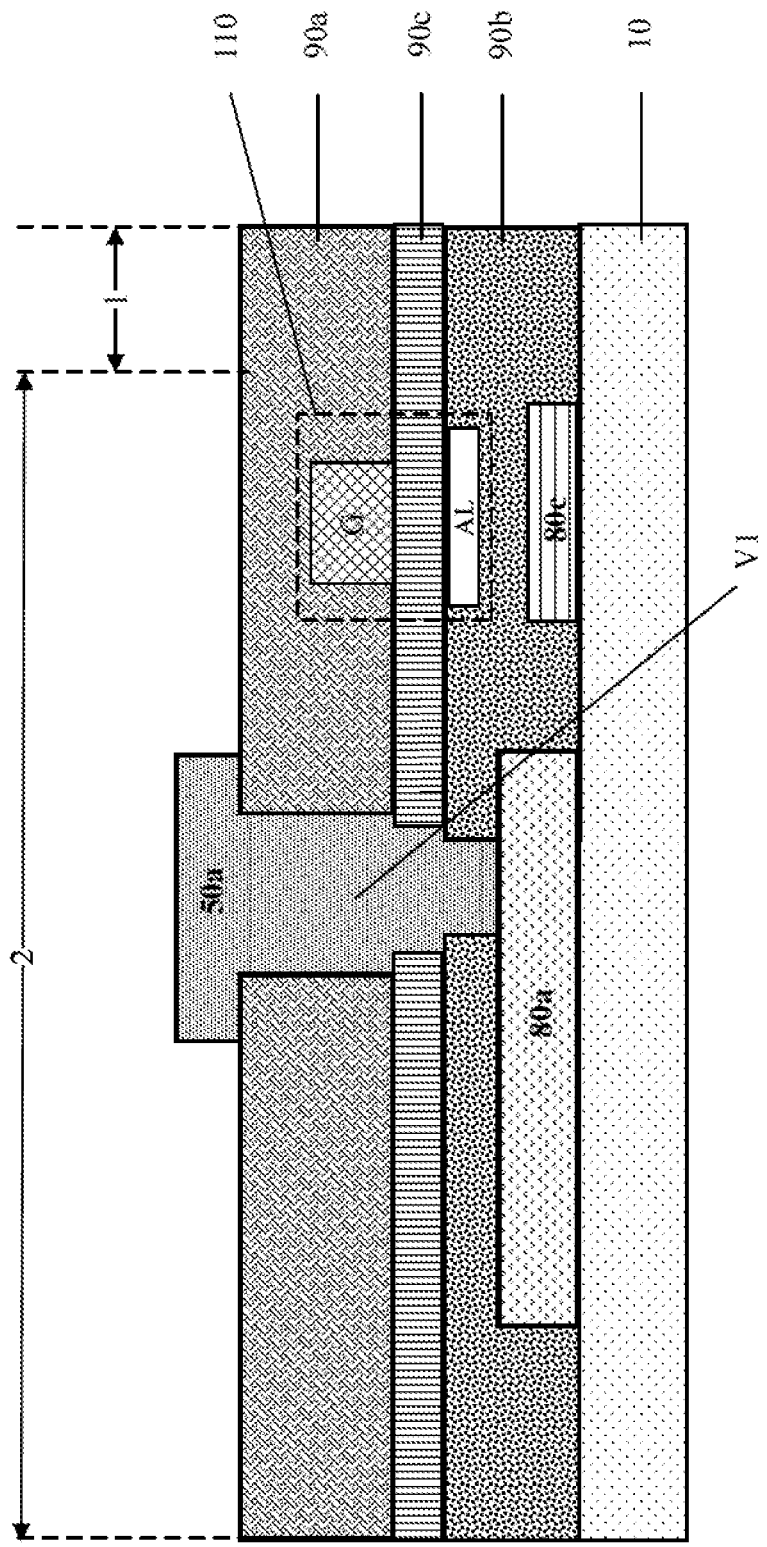
FIG. 7 is a zoom-in view of an area encircled by dotted lines in FIG. 6.

FIG. 6 is a schematic diagram illustrating the structure of a display substrate in some embodiments according to the present disclosure. FIG. 7 is a zoom-in view of an area encircled by dotted lines in FIG. 6. Referring to FIG. 6, the display substrate in some embodiments includes a base substrate 10, a first light shielding layer 80a on the base substrate 10, a second insulating layer 90b on a side of the first light shielding layer 80a distal to the base substrate 10, a first insulating layer 90a on a side of the second insulating layer 90b distal to the base substrate 10, and a first data line 50a on a side of the first insulating layer 90a distal to the second insulating layer 90b. Referring to FIG. 7, the display substrate in some embodiments further includes a thin film transistor 110 for driving image display of the display substrate. The thin film transistor 110 in some embodiments includes a gate electrode G and an active layer AL. The thin film transistor 110 is in the inter-subpixel region 2. The first light shielding layer 80a is in an inter-subpixel region 2 between two adjacent subpixel regions 1. A projection of the first light shielding layer 80a on the base substrate 10 at least partially covers a projection of the inter-subpixel region 2 between two adjacent subpixel regions 1 on the base substrate 10. Optionally, the projection of the first light shielding layer 80a on the base substrate 10 completely covers a projection of the inter-subpixel region 2 between two adjacent subpixel regions 1 on the base substrate 10. Optionally, the first light shielding layer 80a is configured to, alone or in combination with another light shielding layer, block light leakage in the inter-subpixel region 2 between two adjacent subpixel regions 1.

As shown in FIG. 7, the projection of the first light shielding layer 80a on the base substrate 10 is outside a projection of the active layer AL on the base substrate 10, e.g., projections of the first light shielding layer 80a and the active layer AL on the base substrate 10 are substantially non-overlapping. In some embodiments, the display substrate further includes a second light shielding layer 80c. The second light shielding layer 80c is configured to shield the active layer AL (and particularly the channel region of the active layer AL) from light. Optionally, a projection of the second light shielding layer 80c on the base substrate 10 substantially covers a projection of the active layer AL on the base substrate 10. As shown in FIG. 7, the first light shielding layer 80a and the second light shielding layer 80c are in a same layer.

As shown in FIG. 6 and FIG. 7, the display substrate further includes a first via V1 extending through the first insulating layer 90a and the second insulating layer 90b. The first light shielding layer 80a is electrically connected to the first data line 50a through the first via V1. By having this design, the first data line 50a and the first light shielding layer 80a constitute a data line having a double-sublayer structure, the first sublayer being the first data line 50a, the second sublayer being the first light shielding layer 80a. The first sublayer and the second sublayer are electrically connected in parallel for transmitting data signals, effectively lowering the resistance of the data line.

Figure 8:
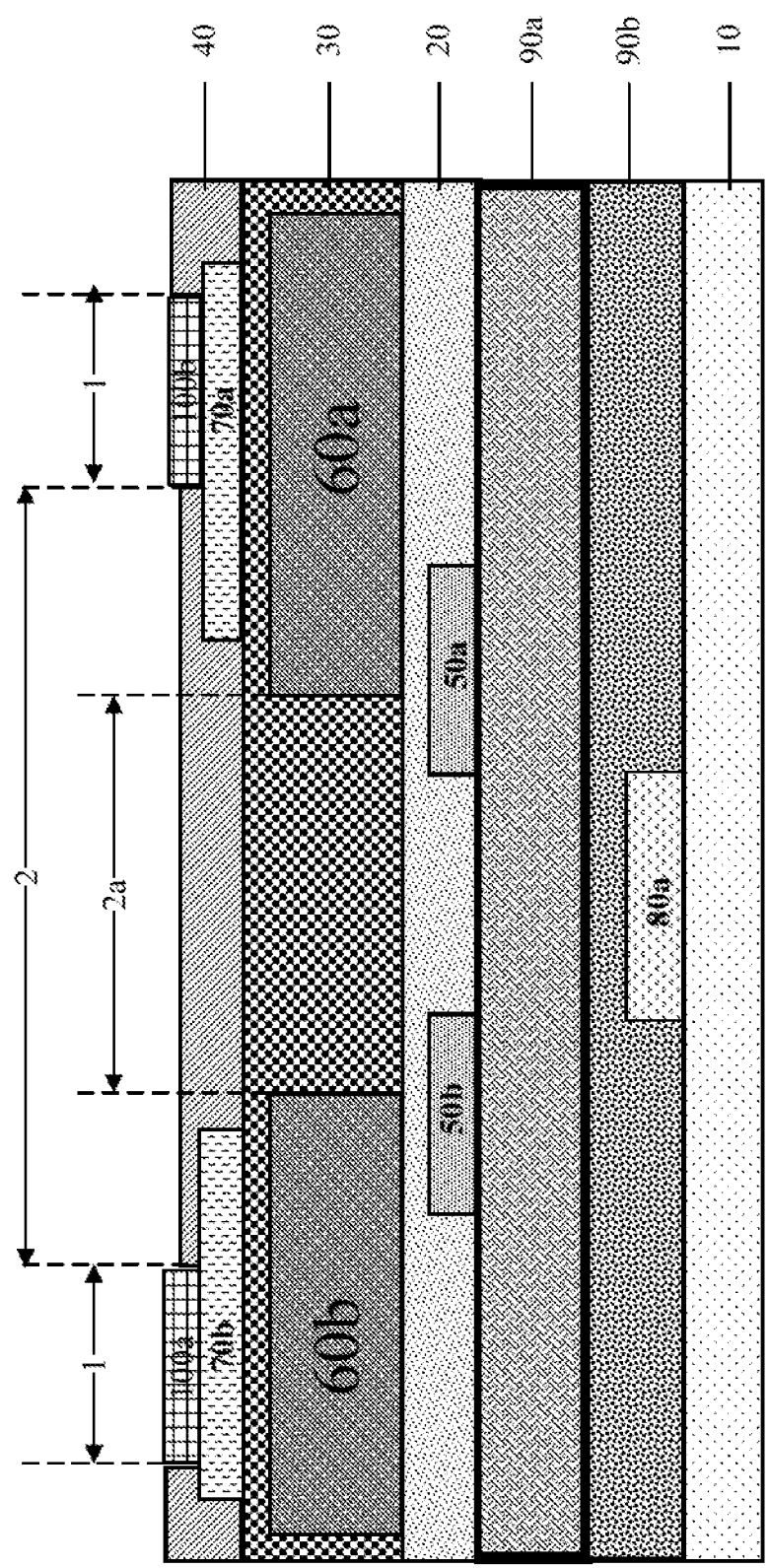
FIG. 8 is a schematic diagram illustrating the structure of a display substrate in some embodiments according to the present disclosure.

FIG. 8 is a schematic diagram illustrating the structure of a display substrate in some embodiments according to the present disclosure. Referring to FIG. 8, in some embodiments, the first light shielding layer 80a is not electrically connected to the first data line 50a. To reduce parasitic capacitance between the first light shielding layer 80a and the data line (e.g., the first data line 50a), a projection of the first light shielding layer 80a on the base substrate 10 in some embodiments is substantially non-overlapping with a projection of any data line (e.g., the first data line 50a) in the display substrate on the base substrate 10. Optionally, the projection of the first light shielding layer 80a on the base substrate 10 partially overlaps with the projection of any data line (e.g., the first data line 50a) in the display substrate on the base substrate 10. Optionally, the projection of the first light shielding layer 80a on the base substrate 10 completely covers a projection of the inter-subpixel region 2 between two adjacent subpixel regions 1 on the base substrate 10.

Figure 9:
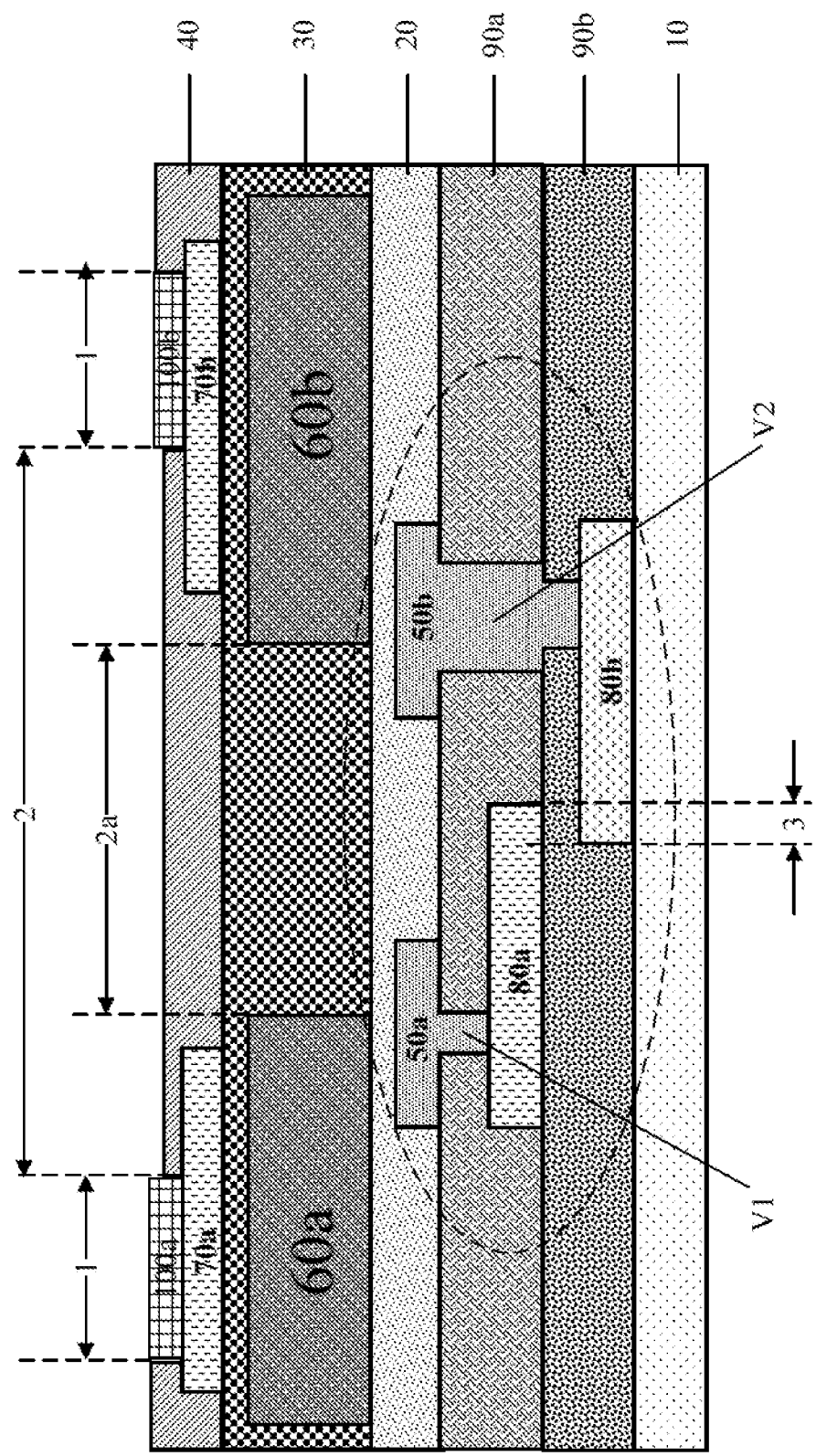
FIG. 9 is a schematic diagram illustrating the structure of a display substrate in some embodiments according to the present disclosure.
Figure 10:
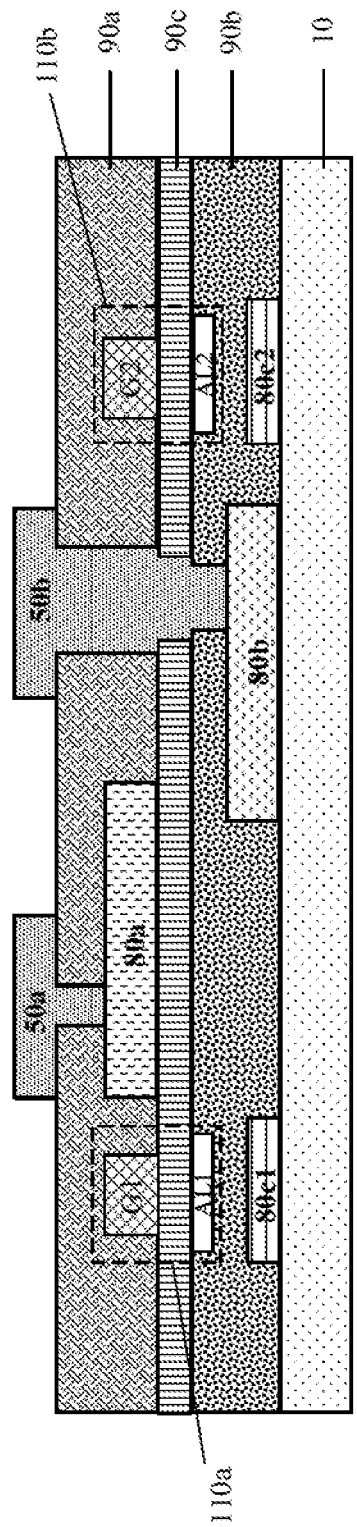
FIG. 10 is a zoom-in view of an area encircled by dotted lines in FIG. 9.

FIG. 9 is a schematic diagram illustrating the structure of a display substrate in some embodiments according to the present disclosure. FIG. 10 is a zoom-in view of an area encircled by dotted lines in FIG. 9. Referring to FIG. 9 and FIG. 10, the display substrate in some embodiments includes a first light shielding layer 80a and a third light shielding layer 80b in the inter-subpixel region 2 between two adjacent subpixel regions 1. The third light shielding layer 80b and the first light shielding layer 80a are in different layers. Optionally, projections of the first light shielding layer 80a and the third light shielding layer 80b on the base substrate 10 are outside the projection of the active layer (e.g., the active layer AL1 of the thin film transistor 110a and the active layer AL2 of the thin film transistor 10b) on the base substrate 10. The first light shielding layer 80a and the third light shielding layer 80b are in the inter-subpixel region 2 between two adjacent subpixel regions 1. A projection of the first light shielding layer 80a on the base substrate 10 at least partially covers a projection of the inter-subpixel region 2 between two adjacent subpixel regions 1 on the base substrate 10. A projection of the third light shielding layer 80b on the base substrate 10 at least partially covers a projection of the inter-subpixel region 2 between two adjacent subpixel regions 1 on the base substrate 10. The first light shielding layer 80a and the third light shielding layer 80b in combination are configured to block light leakage in the inter-subpixel region 2 between two adjacent subpixel regions 1. Combined projections of the first light shielding layer 80a and the third light shielding layer 80b on the base substrate 10 completely covers a projection of the inter-subpixel region 2 between two adjacent subpixel regions 1 on the base substrate 10. Optionally, the projection of the first light shielding layer 80a on the base substrate 10 and the projection of the third light shielding layer 80b on the base substrate 10 partially overlap with each other in an overlapping region 3.

In some embodiments, the display substrate includes the third light shielding layer 80b on the base substrate 10, a second insulating layer 90b on a side of the third light shielding layer 80b distal to the base substrate 10, the first light shielding layer 80a on a side of the second insulating layer 90b distal to the base substrate 10, a first insulting layer 90a on a side of the first light shielding layer 80a distal to the second insulating layer 90b, and a data line layer on a side of the first insulting layer 90a distal to the second insulating layer 90b. The data line layer includes a first data line 50a and a second data line 50b, both of which in the inter-subpixel region 2 between two adjacent subpixel regions 1. Optionally, the second data line 50b and the first data line 50a are in a same layer. The first light shielding layer 80a is electrically connected to the first data line 50a, and the third light shielding layer 80b is electrically connected to the second data line 50b. The first insulating layer 90a is between the first data line 50a and the first light shielding layer 80a. The second insulating layer 90b is between the first insulating layer 90a and the third light shielding layer 80b. e.g., the first insulating layer 90a and the second insulating layer 90b are between the second data line 50b and the third light shielding layer 80b.

In some embodiments, the display substrate further includes a first via V1 extending through the first insulating layer 90a and a second via V2 extending through the first insulating layer 90a and the second insulating layer 90b. The first light shielding layer 80a is electrically connected to the first data line 50a through the first via V1. The third light shielding layer 80b is electrically connected to the second data line 50b through the second via V2.

Referring to FIG. 10, the thin film transistor 110a includes an active layer AL1, a gate insulating layer 90 on the active layer AL, and a gate electrode G1 on a side of the gate insulating layer 90c distal to the active layer AL1. The thin film transistor 110b includes an active layer AL2, a gate insulating layer 90c on the active layer AL2, and a gate electrode G2 on a side of the gate insulating layer 90c distal to the active layer AL2. In some embodiments, the display substrate further includes a light shielding layer 80c on a side of the active layer AL1 distal to the gate electrode G1, a projection of the light shielding layer 80c1 on the base substrate 10 substantially covers a projection of the active layer AL1 on the base substrate 10. In some embodiments, the display substrate further includes a light shielding layer 80cc on a side of the active layer AL2 distal to the gate electrode G2, a projection of the light shielding layer 80c2 on the base substrate 10 substantially covers a projection of the active layer AL2 on the base substrate 10.

Figure 11:
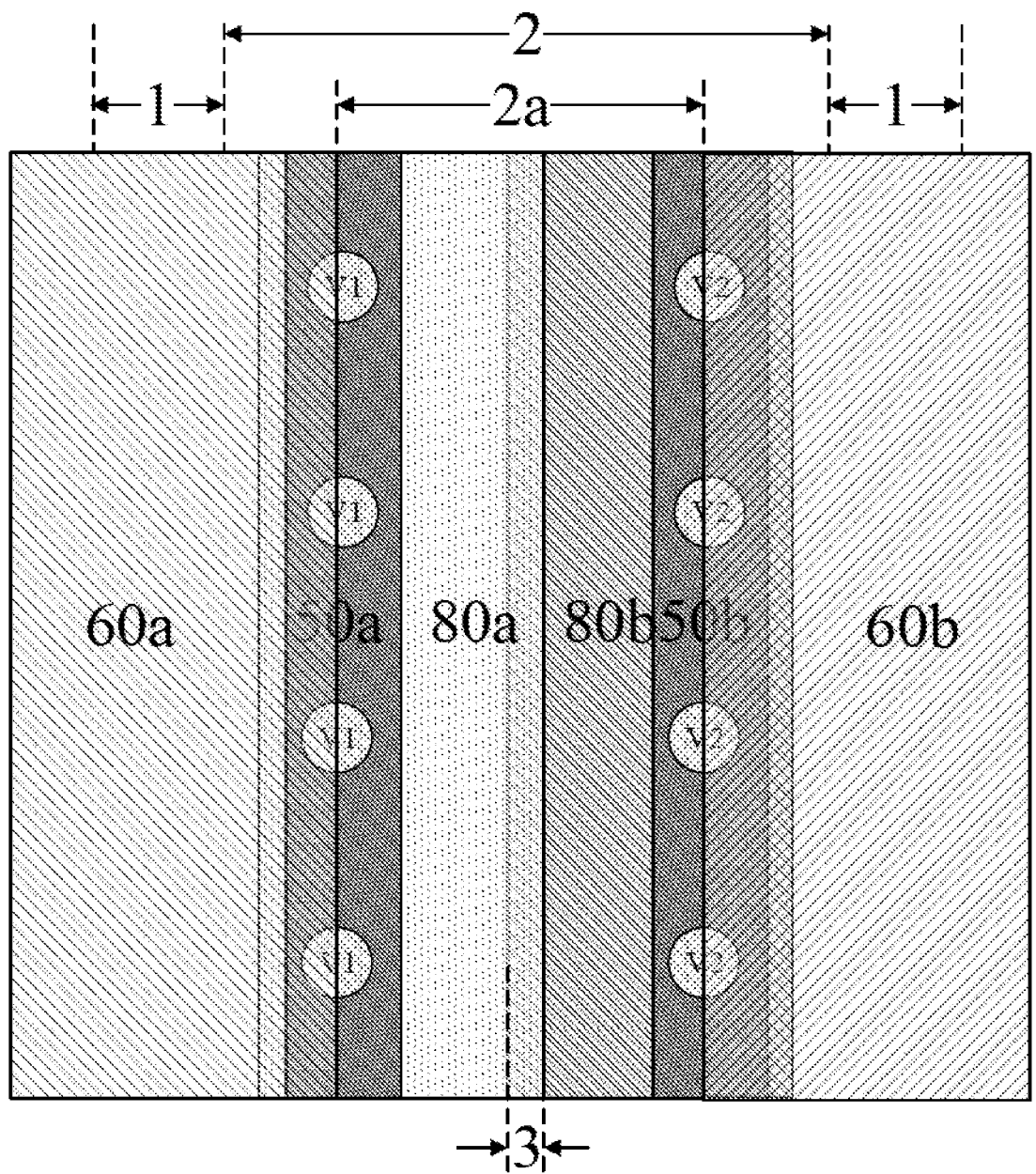
FIG. 11 is a plan view of the display substrate in some embodiments according to the present disclosure.

Referring to FIG. 2, FIG. 5, FIG. 6, FIG. 8 and FIG. 9, the display substrate in some embodiments further includes a passivation layer 20 on a side of the first light shielding layer 80a distal to the base substrate 10, e.g., on a side of the data line layer (the first data line 50a or the second data line 50b) distal to the first insulating layer 90a. Optionally, the display substrate is a color-on-array (COA) display substrate, which further includes a color filter layer. Optionally, the color filter layer is on a side of the passivation layer 20 distal to the first light shielding layer 80a. Optionally, the color filter layer includes a plurality of color filter blocks. FIG. 2. FIG. 5, FIG. 6, FIG. 8 and FIG. 9 show a first color filter block 60a and a second color filter block 60b, corresponding to two adjacent subpixels in a display panel having the present display substrate. As shown in FIG. 2, FIG. 5, FIG. 6, FIG. 8 and FIG. 9, a region between adjacent color filter blocks of the plurality of color filter blocks is in the inter-subpixel region 2 between two adjacent subpixel regions 1, e.g., a region between the first color filter block 60a and the second color filter block 60b is in the inter-subpixel region 2 between two adjacent subpixel regions 1. FIG. 11 is a plan view of the display substrate in some embodiments according to the present disclosure. Referring to FIG. 11, a projection of the inter-subpixel region 2 between two adjacent subpixel regions 1 on the base substrate 10 substantially covers a projection of the region 2a between adjacent color filter blocks of the plurality of color filter blocks on the base substrate 10, e.g., substantially covers the projection of the region 2a between the first color filter block 60a and the second color filter block 60b on the base substrate 10. Referring to FIG. 2, FIG. 5, FIG. 6, FIG. 8 and FIG. 9, the projection of the first light shielding layer 80a on the base substrate 10 at least partially covers a projection of the region 2a between adjacent color filter blocks of the plurality of color filter blocks on the base substrate 10. Referring to FIG. 9 and FIG. 11, the projection of the third light shielding layer 80b on the base substrate 10 at least partially covers a projection of the region 2a between adjacent color filter blocks of the plurality of color filter blocks on the base substrate 10. Optionally, combined projections of the first light shielding layer 80s and the third light shielding layer 80b on the base substrate 10 substantially cover the projection of the region 2a between adjacent color filter blocks of the plurality of color filter blocks on the base substrate 10.

Optionally, the thin film transistor (e.g., the thin film transistor 110 in FIG. 3 and FIG. 7, the thin film transistors 110a and 110b in FIG. 10) is a top-gate type thin film transistor. Optionally, the gate electrode G of the top-gate type thin film transistor is on a side of the active layer AL distal to the base substrate 10.

Referring to FIG. 2, FIG. 5, FIG. 6. FIG. 8, and FIG. 9, the display substrate in some embodiments is an organic light emitting diode display substrate. The display substrate in some embodiments further includes a plurality of organic light emitting diodes, e.g., the organic light emitting diodes 100a and 100b. Optionally, each of the plurality of organic light emitting diodes is on a side of a color filter block of the plurality of color filter blocks distal to the base substrate 10. Optionally, the display substrate is a bottom-emission type display substrate. Optionally, the display substrate is a top-emission type display substrate.

In another aspect, the present disclosure provides a method of fabricating a display substrate. In some embodiments, the method includes forming a thin film transistor for driving image display on a base substrate, and forming first light shielding layer on the base substrate and in an inter-subpixel region between two adjacent subpixel regions. The thin film transistor is formed to include an active layer. The first light shielding layer is formed so that a projection of the first light shielding layer on the base substrate at least partially covers a projection of the inter-subpixel region between two adjacent subpixel regions on the base substrate, and that the projection of the first light shielding layer on the base substrate is outside a projection of the active layer on the base substrate.

In some embodiments, the method further includes forming a first insulating layer on a side of the first light shielding layer distal to the base substrate; forming a first data line in the inter-subpixel region between two adjacent subpixel regions on a side of the first insulating layer distal to the first light shielding layer; and forming a first via extending through the first insulating layer. The first light shielding layer is electrically connected to the first data line through the first via.

The thin film transistor in some embodiments is formed to include a gate electrode. Optionally, the first light shielding layer and the gate electrode of the thin film transistor are formed in a same layer.

In some embodiments, the method further includes forming a second light shielding layer. Optionally, the second light shielding layer is formed so that a projection of the second light shielding layer on the base substrate substantially covers a projection of the active layer on the base substrate. Optionally, the first insulating layer and the second light shielding layer are formed in a same layer.

In some embodiments, the method further includes forming a second insulating layer between the first insulating layer and the base substrate. Optionally, the first via is formed to extend through the first insulating layer and the second insulating layer.

In some embodiments, the method further includes forming a third light shielding layer in the inter-subpixel region between two adjacent subpixel regions, the third light shielding layer and the first light shielding layer are formed in different layers. Optionally, the third light shielding layer is formed so that a projection of the third light shielding layer on the base substrate at least partially covers the projection of the inter-subpixel region between two adjacent subpixel regions on the base substrate; and the projection of the third light shielding layer on the base substrate is outside the projection of the active layer on the base substrate. In some embodiments, the method further includes forming a data line layer including a first data line and a second data line in the inter-subpixel region between two adjacent subpixel regions, the second data line and the first data line in a same layer. Optionally, the first light shielding layer is formed to be electrically connected to the first data line; and the third light shielding layer is formed to be electrically connected to the second data line. In some embodiments, the method further includes forming a first insulating layer between the first data line and the first light shielding layer; forming a first via extending through the first insulating layer; forming a second insulating layer between the first insulating layer and the third light shielding layer, and forming a second via extending through the first insulating layer and the second insulating layer. Optionally, the first light shielding layer is formed to be electrically connected to the first data line through the first via; and the third light shielding layer is formed to be electrically connected to the second data line through the second via. Optionally, the first light shielding layer and the third light shielding layer are formed so that projections of the first light shielding layer and the third light shielding layer on the base substrate partially overlap with each other. Optionally, the first light shielding layer and the third light shielding layer are formed so that combined projections of the first light shielding layer and the third light shielding layer on the base substrate substantially cover the projection of the inter-subpixel region between two adjacent subpixel regions on the base substrate.

In some embodiments, the method further includes forming a passivation layer on a side of the first light shielding layer distal to the base substrate; and forming a color filter layer on a side of the passivation layer distal to the first light shielding layer. The color filter layer is formed to include a plurality of color filter blocks; and that a region between adjacent color filter blocks of the plurality of color filter blocks is in the inter-subpixel region between two adjacent subpixel regions. Optionally, the first light shielding layer is formed so that the projection of the first light shielding layer on the base substrate at least partially covers a projection of the region between adjacent color filter blocks of the plurality of color filter blocks on the base substrate. In some embodiments, the method further includes forming a third light shielding layer in the inter-subpixel region between two adjacent subpixel regions, the third light shielding layer and the first light shielding layer in different layers. Optionally, the third light shielding layer is formed so that a projection of the third light shielding layer on the base substrate at least partially covers the projection of the region between adjacent color filter blocks of the plurality of color filter blocks on the base substrate; and the projection of the third light shielding layer on the base substrate is outside the projection of the active layer on the base substrate. In some embodiments, the method further includes forming a data line layer including a first data line and a second data line in the inter-subpixel region between two adjacent subpixel regions, the second data line and the first data line in a same layer. Optionally, the first light shielding layer is formed to be electrically connected to the first data line; and the third light shielding layer is formed to be electrically connected to the second data line. In some embodiments, the method further includes forming a second insulating layer on a side of the third light shielding layer distal to the base substrate, the second insulating layer between the first light shielding layer and the third light shielding layer; forming a first insulating layer on a side of the first light shielding layer distal to the second insulating layer, the first insulating layer between the first light shielding layer and the first data line; forming a first via extending through the first insulating layer, and forming a second via extending through the first insulating layer and the second insulating layer. Optionally, the first light shielding layer is formed to be electrically connected to the first data line through the first via, and the third light shielding layer is formed to be electrically connected to the second data line through the second via. Optionally, the first light shielding layer and the third light shielding layer are formed so that combined projections of the first light shielding layer and the third light shielding layer on the base substrate substantially cover the projection of the region between adjacent color filter blocks of the plurality of color filter blocks on the base substrate. Optionally, the thin film transistor is formed to include a gate electrode. Optionally, the first light shielding layer and the gate electrode of the thin film transistor are formed in a same layer. In some embodiments, the method further includes forming a second light shielding layer, a projection of the second light shielding layer on the base substrate is formed to substantially covers a projection of the active layer on the base substrate. Optionally, the third insulating layer and the second light shielding layer are formed in a same layer.

Optionally, the thin film transistor is a top-gate type thin film transistor; and the gate electrode is formed on a side of the active layer distal to the base substrate.

In some embodiments, the method further includes forming plurality of organic light emitting diodes, each of which is formed on a side of a color filter block of the plurality of color filter blocks distal to the base substrate. Optionally, the display substrate is an organic light emitting diode display substrate. Optionally, the display substrate is a bottom-emission type display substrate.

Various appropriate materials may be used for making the light shielding layer, e.g., the first light shielding layer, the second light shielding layer, or the third light shielding layer. Examples of appropriate light shielding materials include, but are not limited to, metals, alloys, black materials such as a carbon material, and so on.

Figure 12A:
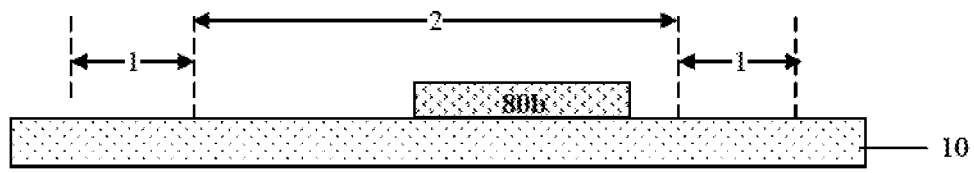
FIG. 12A to 12H illustrate a process of fabricating a display substrate in some embodiments according to the present disclosure.
Figure 12B:
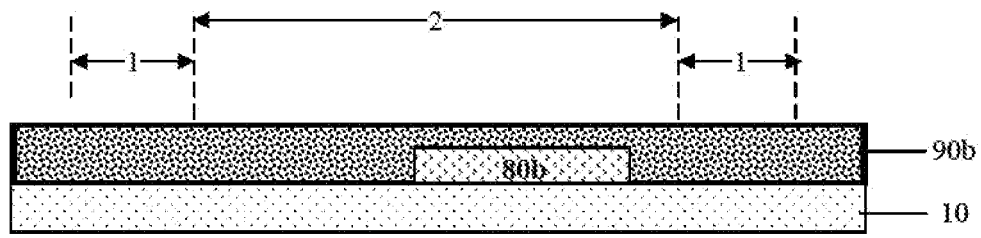
Figure 12C:
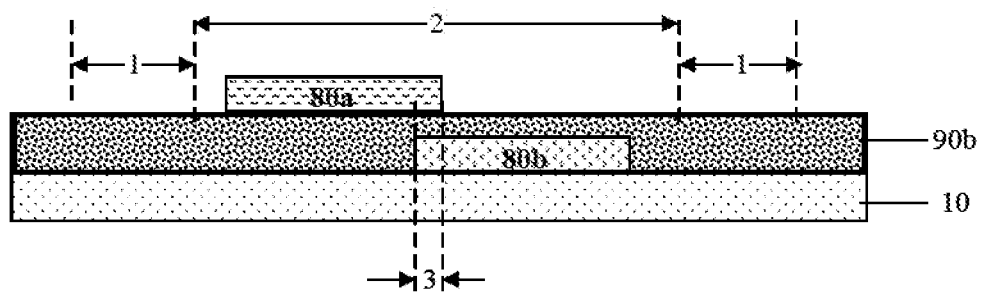
Figure 12D:
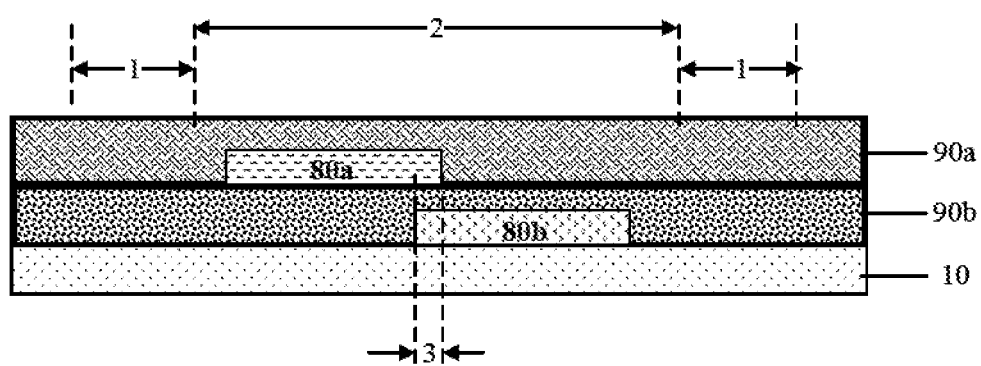
Figure 12E:
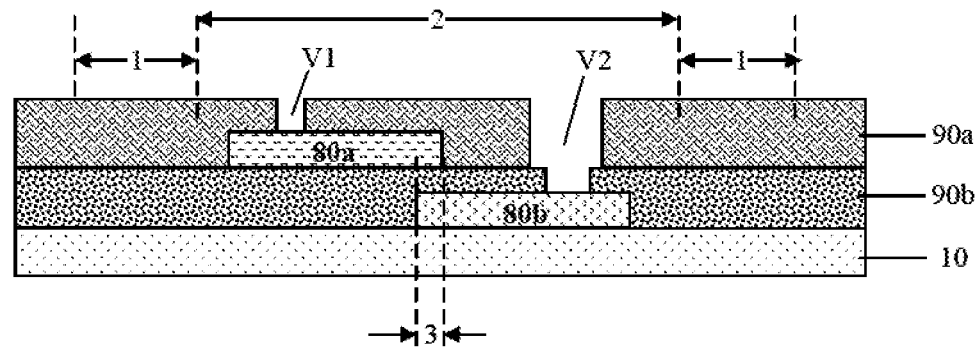
Figure 12F:
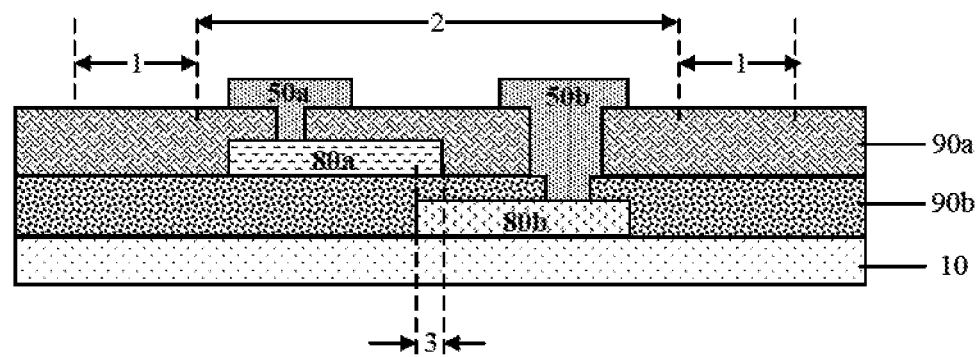
Figure 12G:
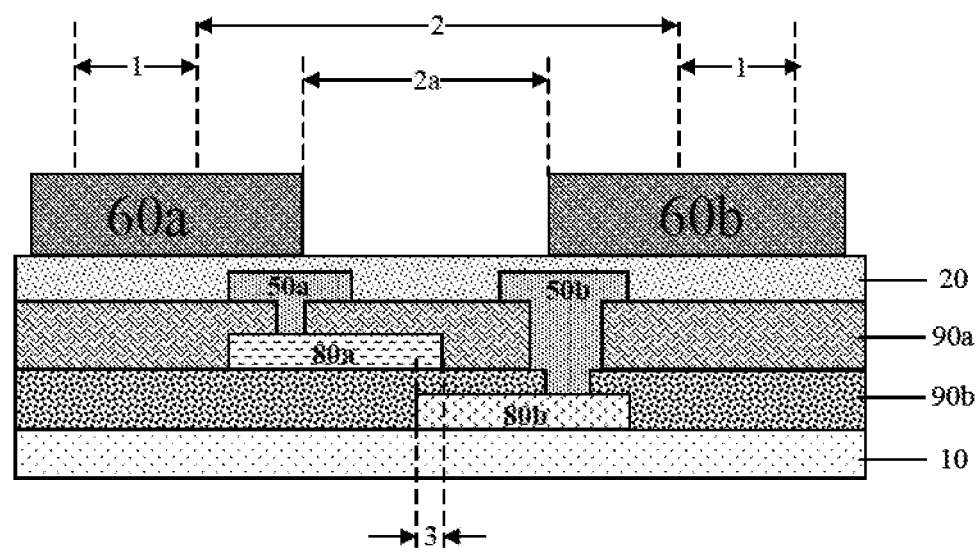
Figure 12H:
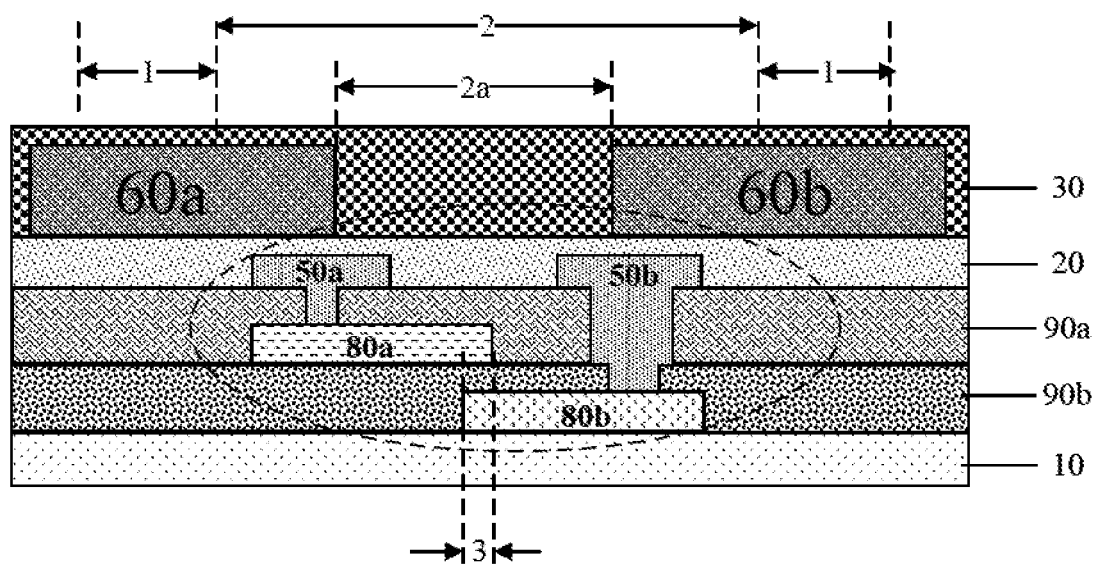

FIG. 12A to 12H illustrate a process of fabricating a display substrate in some embodiments according to the present disclosure. Referring to FIG. 12A, in some embodiments, a third light shielding layer 80b is first formed on a base substrate 10. The third light shielding layer 80b is formed in an inter-subpixel region 2 between two adjacent subpixel regions 1 of the display substrate to be formed. Referring to FIG. 12B, a second insulating layer 90b is then formed on a side of the third light shielding layer 80b distal to the base substrate 10. Referring to FIG. 12C, a first light shielding layer 80a is formed on a side of the second insulating layer 90b distal to the base substrate 10. The first light shielding layer 80a is formed in an inter-subpixel region 2 between two adjacent subpixel regions 1 of the display substrate to be formed. The first light shielding layer 80a and the third light shielding layer 80b are formed so that the projection of the first light shielding layer 80a on the base substrate 10 and the projection of the third light shielding layer 80b on the base substrate 10 partially overlap with each other in an overlapping region 3. Referring to FIG. 12D, a first insulating layer 90a is formed on a side of the first light shielding layer 80a distal to the second insulating layer 90b. Referring to FIG. 12E, a first via V1 is formed to extend through the first insulating layer 90a, exposing a portion of the first light shielding layer 80a underneath; and a second via V2 is formed to extend through the first insulating layer 90a and the second insulating layer 90b, exposing a portion of the third light shielding layer 80b underneath. Referring to FIG. 12F, a data line layer including a first data line 50a and a second data line 50b in the inter-subpixel region 2 between two adjacent subpixel regions 1 is formed on a side of the first insulating layer 90a distal to the second insulating layer 90b. The first data line 50a is formed to be electrically connected to the first light shielding layer 80a through the first via V1, the second data line 50b is formed to be electrically connected to the third light shielding layer 80b through the second via V2. Referring to FIG. 12G, a passivation layer 20 is formed on a side of the first insulating layer 90a distal to the second insulating layer 90b. Further, a color filter layer including a first color filter block 60a and a second color filter block 60b is formed on a side of the passivation layer 20 distal to the first insulating layer 90a. The color filter layer is formed so that a region 2a between adjacent color filter blocks of the plurality of color filter blocks (e.g., between the first color filter block 60a and the second color filter block 60b) is in the inter-subpixel region 2 between two adjacent subpixel regions 1. The first light shielding layer 80a and the third light shielding layer 80b are formed so that combined projections of the first light shielding layer 80a and the third light shielding layer 80b on the base substrate 10 substantially cover the projection of the region 2a between adjacent color filter blocks of the plurality of color filter blocks on the base substrate 10. Referring to 12H, a planarization layer 30 is formed on a side of the color filter layer distal to the passivation layer 20. Referring to FIG. 9, on top of the planarization layer 30, a pixel definition layer 40 and a plurality of organic light emitting diodes are formed, e.g., a first organic light emitting diode 100a and a second organic light emitting diode 100b. The first organic light emitting diode 100a is formed to include a first anode 70a, and the second organic light emitting diode 100b is formed to include a second anode 70b.

In another aspect, the present disclosure provides a display panel having a display substrate described herein or fabricated by a method described herein. In some embodiments, the display panel further includes an encapsulating layer on the display substrate. In some embodiments, the display panel further includes a counter substrate facing the display substrate.

In another aspect, the present disclosure provides a display apparatus having a display substrate described herein or fabricated by a method described herein. Optionally, the display apparatus is a liquid crystal display apparatus. Optionally, the display apparatus is an organic light emitting diode display apparatus. Optionally, the display apparatus is a top-gate bottom emission type organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
   a base substrate;
   a thin film transistor for driving image display comprising an active layer;
   a first light shielding layer and a third light shielding layer on the base substrate and in an inter-subpixel region between two adjacent subpixel regions; and
   a first data line and a second data line in the inter-subpixel region between two adjacent subpixel regions, the second data line and the first data line in a same layer;
   wherein the third light shielding layer and the first light shielding layer are in different layers and electrically isolated from each other;
   projections of the first light shielding layer and the third light shielding layer on the base substrate are outside a projection of the active layer on the base substrate, and partially overlap with each other in an overlapping region which is inside the inter-subpixel region; and
   the first light shielding layer is electrically connected to the first data line; and
   the third light shielding layer is electrically connected to the second data line.

2. The display substrate of claim 1, further comprising:
   a first insulating layer on a side of the first light shielding layer distal to the base substrate; and
   a first via extending through the first insulating layer;
   wherein the first light shielding layer is electrically connected to the first data line through the first via, and the first data line is on a side of the first insulating layer distal to the first light shielding layer.

3. The display substrate of claim 2, further comprising a second insulating layer between the first insulating layer and the base substrate;
   wherein the first via extends through the first insulating layer and the second insulating layer.

4. The display substrate of claim 1, wherein the thin film transistor comprises a gate electrode in a same layer as the first light shielding layer.

5. The display substrate of claim 1, further comprising a second light shielding layer;
   wherein a projection of the second light shielding layer on the base substrate substantially covers a projection of the active layer on the base substrate.

6. The display substrate of claim 1, wherein a projection of the first light shielding layer on the base substrate at least partially covers a projection of the inter-subpixel region between two adjacent subpixel regions on the base substrate; and a projection of the third light shielding layer on the substrate at least partially covers the projection of the inter-subpixel region between two adjacent subpixel regions on the base substrate.

7. The display substrate of claim 1, further comprising a first insulating layer between the first data line and the first light shielding layer;
a first via extending through the first insulating layer;
a second insulating layer between the first insulating layer and the third light shielding layer; and
a second via extending through the first insulating layer and the second insulating layer;
wherein the first light shielding layer is electrically connected to the first data line through the first via; and
the third light shielding layer is electrically connected to the second data line through the second via.

8. The display substrate of claim 1, further comprising:
a passivation layer on a side of the first light shielding layer distal to the base substrate; and
a color filter layer on a side of the passivation layer distal to the first light shielding layer;
wherein the color filter layer comprises a plurality of color filter blocks;
a region between adjacent color filter blocks of the plurality of color filter blocks is in the inter-subpixel region between two adjacent subpixel regions; and
a projection of the first light shielding layer on the base substrate at least partially covers a projection of the region between adjacent color filter blocks of the plurality of color filter blocks on the base substrate.

9. The display substrate of claim 8, wherein a projection of the third light shielding layer on the base substrate at least partially covers the projection of the region between adjacent color filter blocks of the plurality of color filter blocks on the base substrate.

10. The display substrate of claim 9, further comprising:
a second insulating layer on a side of the third light shielding layer distal to the base substrate, the second insulating layer between the first light shielding layer and the third light shielding layer;
a first insulating layer on a side of the first light shielding layer distal to the second insulating layer, the first insulating layer between the first light shielding layer and the first data line;
a first via extending through the first insulating layer; and
a second via extending through the first insulating layer and the second insulating layer;
wherein the first light shielding layer is electrically connected to the first data line through the first via; and
the third light shielding layer is electrically connected to the second data line through the second via.

11. The display substrate of claim 9, wherein combined projections of the first light shielding layer and the third light shielding layer on the base substrate completely cover the projection of the region between adjacent color filter blocks of the plurality of color filter blocks on the base substrate.

12. The display substrate of claim 9, wherein the thin film transistor comprises a gate electrode in a same layer as the first light shielding layer;
the display substrate further comprises a second light shielding layer, a projection of the second light shielding layer on the base substrate substantially covers a projection of the active layer on the base substrate; and
the third light shielding layer and the second light shielding layer are in a same layer.

13. The display substrate of claim 12, wherein the thin film transistor is a top-gate type thin film transistor; and the gate electrode is on a side of the active layer distal to the base substrate.

14. The display substrate of claim 13, wherein the display substrate is an organic light emitting diode display substrate; and
the display substrate further comprises a plurality of organic light emitting diodes, each of which on a side of a color filter block of the plurality of color filter blocks distal to the base substrate.

15. The display substrate of claim 14, wherein the display substrate is a bottom-emission type display substrate.

16. A display apparatus, comprising the display substrate of claim 1.

17. A display substrate, comprising:
a base substrate;
a thin film transistor for driving image display comprising an active layer;
a first light shielding layer and a third light shielding layer on the base substrate and in an inter-subpixel region between two adjacent subpixel regions; and
a first data line and a second data line in the inter-subpixel region between two adjacent subpixel regions, and configured to transmit data signals to the two adjacent subpixel regions, respectively;
wherein the third light shielding layer and the first light shielding layer are in different layers and electrically isolated from each other;
projections of the first light shielding layer and the third light shielding layer on the base substrate are outside a projection of the active layer on the base substrate, and partially overlap with each other in an overlapping region which is inside the inter-subpixel region;
a projection of the first light shielding layer on the base substrate partially overlaps with a projection of the first data line on the base substrate, and is non-overlapping with a projection of the second data line on the base substrate;
a projection of the third light shielding layer on the base substrate partially overlaps with the projection of the second data line on the base substrate, and is non-overlapping with the projection of the first data line on the base substrate; and
the first data line and the second data line are completely outside the overlapping region.

18. A display substrate, comprising:
a base substrate;
a thin film transistor for driving image display comprising an active layer; and
a first light shielding layer and a third light shielding layer on the base substrate and in an inter-subpixel region between two adjacent subpixel regions;
wherein the third light shielding layer and the first light shielding layer are in different layers and electrically isolated from each other;
projections of the first light shielding layer and the third light shielding layer on the base substrate are outside a projection of the active layer on the base substrate, and partially overlap with each other in an overlapping region which is inside the inter-subpixel region; and
combined projections of the first light shielding layer and the third light shielding layer on the base substrate completely cover the projection of the inter-subpixel region between two adjacent subpixel regions on the base substrate.

* * * * *